US009268719B2

(12) United States Patent
Shaeffer (10) Patent No.: US 9,268,719 B2
(45) Date of Patent: Feb. 23, 2016

(54) MEMORY SIGNAL BUFFERS AND MODULES SUPPORTING VARIABLE ACCESS GRANULARITY

(75) Inventor: Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 394 days.

(21) Appl. No.: 13/566,417

(22) Filed: Aug. 3, 2012

(65) Prior Publication Data

US 2013/0036273 A1 Feb. 7, 2013

Related U.S. Application Data

(60) Provisional application No. 61/515,651, filed on Aug. 5, 2011.

(51) Int. Cl.
*G06F 3/00* (2006.01)
*G06F 13/00* (2006.01)
*G06F 13/16* (2006.01)

(52) U.S. Cl.
CPC ...................... *G06F 13/16* (2013.01)

(58) Field of Classification Search
CPC ...................................................... G06F 13/16
See application file for complete search history.

(56) References Cited

U.S. PATENT DOCUMENTS

| 4,377,855 A | 3/1983 | Lavi ................................ 365/49 |
| 4,542,483 A | 9/1985 | Procyk .......................... 365/190 |
| 4,569,036 A | 2/1986 | Fujii .............................. 365/230 |
| 4,633,434 A | 12/1986 | Scheuneman ................. 364/900 |
| 4,636,982 A | 1/1987 | Takemae et al. .............. 365/149 |
| 4,646,268 A | 2/1987 | Kuno ............................. 365/179 |
| 4,654,781 A | 3/1987 | Schwartz et al. ............. 364/200 |
| 4,670,745 A | 6/1987 | O'Malley et al. ............. 340/801 |
| 4,698,788 A | 10/1987 | Flannagan ..................... 365/205 |
| 4,700,328 A | 10/1987 | Burghard ........................ 365/51 |
| 4,710,902 A | 12/1987 | Pelley, III ..................... 365/222 |
| 4,740,921 A | 4/1988 | Lewandowski ............... 365/189 |
| 4,758,993 A | 7/1988 | Takemae ....................... 365/222 |
| 4,766,538 A | 8/1988 | Miyoshi ........................ 364/200 |

(Continued)

FOREIGN PATENT DOCUMENTS

| DE | 102005021894 | 1/2006 | ............... G11C 8/06 |
| EP | 0339224 A2 | 11/1989 | ............... G11C 7/00 |

(Continued)

OTHER PUBLICATIONS

Yoon et al., "A 2.5V 333Mb/pin 1Gb Double Data Rate SDRAM," ISSCC Digest of Technical Papers, Feb. 17, 1999. 11 pages.

(Continued)

*Primary Examiner* — Henry Tsai
*Assistant Examiner* — Jing-Yih Shyu
(74) *Attorney, Agent, or Firm* — Silicon Edge Law Group LLP; Arthur J. Behiel (57) ABSTRACT

Described are memory modules that include a configurable signal buffer that manages communication between memory devices and a memory controller. The buffer can be configured to support threading to reduce access granularity, the frequency of row-activation, or both. The buffer can translate controller commands to access information of a specified granularity into subcommands seeking to access information of reduced granularity. The reduced-granularity information can then be combined, as by concatenation, and conveyed to the memory controller as information of the specified granularity.

19 Claims, 7 Drawing Sheets

(56) References Cited

U.S. PATENT DOCUMENTS

| | | | |
|---|---|---|---|
| 4,768,157 A | 8/1988 | Chauvel et al. ............... 364/521 |
| 4,787,858 A | 11/1988 | Killian, Jr. .................... 439/350 |
| 4,796,230 A | 1/1989 | Young .......................... 365/189 |
| 4,800,525 A | 1/1989 | Shah ............................... 365/72 |
| 4,811,302 A | 3/1989 | Koishi ........................... 365/222 |
| 4,825,413 A | 4/1989 | Tran .............................. 365/189 |
| 4,837,465 A | 6/1989 | Rubinstein ................... 307/530 |
| 4,837,743 A | 6/1989 | Chiu ................................ 371/51 |
| 4,843,264 A | 6/1989 | Galbraith ...................... 307/530 |
| 4,862,421 A | 8/1989 | Tran .......................... 365/189.07 |
| 4,888,732 A | 12/1989 | Inoue .............................. 365/51 |
| 4,903,344 A | 2/1990 | Inoue .............................. 365/51 |
| 4,961,168 A | 10/1990 | Tran .......................... 365/189.11 |
| 4,982,370 A | 1/1991 | Matsumoto ................... 365/222 |
| 4,984,196 A | 1/1991 | Tran ................................ 365/51 |
| 4,985,867 A | 1/1991 | Ishii et al. .................... 365/221 |
| 4,991,141 A | 2/1991 | Tran .............................. 365/207 |
| 5,046,050 A | 9/1991 | Kertis ........................... 365/208 |
| 5,093,806 A | 3/1992 | Tran .......................... 365/189.11 |
| 5,111,434 A | 5/1992 | Cho .............................. 365/207 |
| 5,119,340 A | 6/1992 | Slemmer ................... 365/230.03 |
| 5,121,358 A | 6/1992 | Slemmer ...................... 365/266 |
| 5,124,610 A | 6/1992 | Conley .......................... 310/303 |
| 5,124,951 A | 6/1992 | Slemmer ................... 365/230.06 |
| 5,128,897 A | 7/1992 | McClure .................... 365/230.06 |
| 5,132,931 A | 7/1992 | Koker ........................... 365/210 |
| 5,146,592 A | 9/1992 | Pfeiffer et al. ................ 395/157 |
| 5,150,330 A | 9/1992 | Hag ........................... 365/230.03 |
| 5,181,205 A | 1/1993 | Kertis .......................... 371/21.1 |
| 5,193,072 A | 3/1993 | Frenkil ......................... 365/222 |
| 5,193,074 A | 3/1993 | Anami ...................... 365/230.03 |
| 5,214,610 A | 5/1993 | Houston ..................... 365/235.3 |
| 5,222,047 A | 6/1993 | Matsuda et al. .......... 365/230.03 |
| 5,241,503 A | 8/1993 | Cheng .......................... 365/205 |
| 5,249,165 A | 9/1993 | Toda ......................... 365/189.04 |
| 5,251,178 A | 10/1993 | Childers ....................... 365/227 |
| 5,263,002 A | 11/1993 | Suzuki ...................... 365/230.05 |
| 5,267,215 A | 11/1993 | Tsujimoto ................. 365/230.03 |
| 5,274,596 A | 12/1993 | Watanabe ..................... 365/203 |
| 5,291,444 A | 3/1994 | Scott ......................... 365/189.05 |
| 5,301,162 A | 4/1994 | Shimizu .................... 365/230.03 |
| 5,305,280 A | 4/1994 | Hayano ..................... 365/230.03 |
| 5,321,646 A | 6/1994 | Tomishima .................... 365/51 |
| 5,337,283 A | 8/1994 | Ishikawa ....................... 365/222 |
| 5,343,438 A | 8/1994 | Choi ............................. 365/233 |
| 5,383,159 A | 1/1995 | Kubota ......................... 365/207 |
| 5,390,308 A | 2/1995 | Ware ............................. 395/400 |
| 5,394,528 A | 2/1995 | Kobayashi et al. ........... 395/325 |
| 5,406,526 A | 4/1995 | Sugibayashi ............. 365/230.03 |
| 5,414,662 A | 5/1995 | Foss .............................. 365/203 |
| 5,418,737 A | 5/1995 | Tran .............................. 365/203 |
| 5,428,389 A | 6/1995 | Ito ................................. 348/231 |
| 5,432,743 A | 7/1995 | Kusakari ....................... 365/196 |
| 5,455,802 A | 10/1995 | McClure ....................... 365/233 |
| 5,471,425 A | 11/1995 | Yumitori ....................... 365/190 |
| 5,485,430 A | 1/1996 | McClure ....................... 365/233 |
| 5,517,456 A | 5/1996 | Chishiki .................... 365/230.03 |
| 5,530,814 A | 6/1996 | Wong et al. ................... 395/312 |
| 5,546,346 A | 8/1996 | Agata et al. .................. 365/203 |
| 5,559,970 A | 9/1996 | Sharma ......................... 395/312 |
| 5,587,960 A | 12/1996 | Ferris ........................ 365/230.03 |
| 5,614,855 A | 3/1997 | Lee .............................. 327/158 |
| 5,652,870 A | 7/1997 | Yamasaki et al. ............. 395/500 |
| 5,655,113 A | 8/1997 | Leung et al. .................. 395/552 |
| 5,666,322 A | 9/1997 | Conkle ......................... 365/233 |
| 5,675,180 A | 10/1997 | Pedersen |
| 5,689,472 A | 11/1997 | Tanaka et al. ............ 365/230.02 |
| 5,717,871 A | 2/1998 | Hsieh et al. ................... 395/250 |
| 5,717,901 A | 2/1998 | Sung et al. ................ 395/497.01 |
| 5,748,561 A | 5/1998 | Hotta ......................... 365/238.5 |
| 5,751,657 A | 5/1998 | Hotta ......................... 365/238.5 |
| 5,787,267 A | 7/1998 | Leung et al. .................. 395/482 |
| 5,793,998 A | 8/1998 | Copeland et al. ............. 395/201 |
| 5,801,985 A | 9/1998 | Roohparvar et al. ..... 365/185.01 |
| 5,852,725 A | 12/1998 | Yen .............................. 395/282 |
| 5,864,505 A | 1/1999 | Higuchi ..................... 365/189.4 |
| 5,875,132 A | 2/1999 | Ozaki ....................... 365/189.03 |
| 5,881,017 A | 3/1999 | Matsumoto et al. ..... 365/230.04 |
| 5,892,981 A | 4/1999 | Wiggers ........................ 395/878 |
| 5,893,927 A | 4/1999 | Hovis ............................ 711/171 |
| 5,903,509 A | 5/1999 | Ryan et al. ................ 365/230.03 |
| 5,933,387 A | 8/1999 | Worley ...................... 365/230.03 |
| 5,936,885 A | 8/1999 | Morita ...................... 365/185.09 |
| 5,958,033 A | 9/1999 | Schubert et al. .............. 710/126 |
| 5,963,488 A | 10/1999 | Inoue ............................ 365/200 |
| 5,982,981 A | 11/1999 | Satoh |
| 5,996,051 A | 11/1999 | Mergard ....................... 711/147 |
| 6,018,478 A | 1/2000 | Higuchi .................... 365/189.01 |
| 6,034,878 A | 3/2000 | Osaka et al. .................... 365/52 |
| 6,047,347 A | 4/2000 | Hansen et al. ................ 710/127 |
| 6,049,855 A | 4/2000 | Jeddeloh ....................... 711/157 |
| 6,050,983 A | 4/2000 | Moore et al. .................. 604/333 |
| 6,075,728 A | 6/2000 | Inoue ....................... 698/189.01 |
| 6,125,157 A | 9/2000 | Donnelly ...................... 375/371 |
| 6,138,185 A | 10/2000 | Nelson et al. ................... 710/33 |
| 6,141,273 A | 10/2000 | Ku et al. ....................... 365/201 |
| 6,144,220 A | 11/2000 | Young et al. ................... 326/41 |
| 6,160,750 A | 12/2000 | Shieh ........................ 365/230.03 |
| 6,163,491 A | 12/2000 | Iwamoto et al. .............. 365/201 |
| 6,185,149 B1 | 2/2001 | Fujioka et al. ................ 365/233 |
| 6,240,039 B1 | 5/2001 | Lee et al. .................. 365/230.06 |
| 6,240,040 B1 | 5/2001 | Akaogi et al. ........... 365/230.06 |
| 6,247,084 B1 | 6/2001 | Apostol et al. ................ 710/108 |
| RE37,409 E | 10/2001 | Richardson et al. |
| 6,311,313 B1 | 10/2001 | Camporese et al. .............. 716/6 |
| 6,356,975 B1 | 3/2002 | Barth ............................ 711/105 |
| 6,363,454 B1 | 3/2002 | Lakhani et al. ............... 711/100 |
| 6,366,995 B1 | 4/2002 | Vilkov et al. ................. 711/206 |
| 6,393,543 B1 | 5/2002 | Vilkov et al. ................. 711/202 |
| 6,396,764 B1 | 5/2002 | Holland ................... 365/230.03 |
| 6,434,081 B1 | 8/2002 | Johnson et al. ............... 365/233 |
| 6,446,158 B1 | 9/2002 | Karabatsos ....................... 711/5 |
| 6,587,917 B2 | 7/2003 | Simmons ...................... 711/105 |
| 6,625,687 B1 | 9/2003 | Halbert et al. ................ 711/105 |
| 6,680,736 B1 | 1/2004 | Cho .............................. 345/519 |
| 6,687,796 B1 | 2/2004 | Laine et al. ................... 711/149 |
| 6,725,316 B1 | 4/2004 | Gans ............................. 710/307 |
| 6,742,098 B1 | 5/2004 | Halbert et al. ................ 711/172 |
| 6,748,556 B1 | 6/2004 | Storino et al. ................... 714/42 |
| 6,754,120 B1 | 6/2004 | Bellows ........................ 365/205 |
| 6,813,688 B2 | 11/2004 | Wu et al. ...................... 711/114 |
| 6,825,841 B2 | 11/2004 | Hampel ........................ 345/519 |
| 6,854,042 B1 | 2/2005 | Karabatsos ................... 711/167 |
| 6,877,079 B2 | 4/2005 | Yoo et al. ..................... 711/167 |
| 6,885,572 B2 | 4/2005 | Fujisawa ......................... 365/63 |
| 6,895,474 B2 | 5/2005 | Ryan et al. .................... 711/137 |
| 6,920,540 B2 | 7/2005 | Hampel ........................ 711/167 |
| 7,039,782 B2 | 5/2006 | Garrett, Jr. .................... 711/167 |
| 7,187,572 B2 | 3/2007 | Perego et al. ................... 365/63 |
| 7,254,075 B2 | 8/2007 | Woo ............................. 365/207 |
| 7,266,667 B2 | 9/2007 | Oh ................................ 711/200 |
| 7,280,428 B2 | 10/2007 | Ware ........................ 365/230.02 |
| 7,281,079 B2 | 10/2007 | Bains et al. ...................... 711/5 |
| 7,363,422 B2 | 4/2008 | Perego .......................... 711/105 |
| 7,369,444 B2 | 5/2008 | Perego ..................... 365/189.01 |
| 7,386,696 B2 * | 6/2008 | Jakobs et al. ................. 711/167 |
| 7,505,356 B2 | 3/2009 | Ware ........................ 365/230.06 |
| 7,729,151 B2 * | 6/2010 | Tsern et al. ..................... 365/51 |
| 7,907,470 B2 | 3/2011 | Ware ........................ 365/230.06 |
| 8,028,144 B2 | 9/2011 | Hampel ........................ 711/168 |
| 8,050,134 B2 | 11/2011 | Ware ........................ 365/230.06 |
| 8,489,839 B1 * | 7/2013 | Karandikar et al. .......... 711/167 |
| 2001/0037428 A1 | 11/2001 | Hsu ............................... 711/105 |
| 2003/0009612 A1 | 1/2003 | Latta ............................. 710/240 |
| 2003/0048616 A1 | 3/2003 | Ko et al. ....................... 361/736 |
| 2003/0052885 A1 | 3/2003 | Hampel ........................ 345/501 |
| 2003/0174573 A1 | 9/2003 | Suzuki et al. ............ 365/230.03 |
| 2003/0197201 A1 | 10/2003 | Yanagawa ..................... 257/200 |
| 2004/0019756 A1 | 1/2004 | Perego .......................... 711/170 |
| 2004/0037133 A1 | 2/2004 | Park et al. ..................... 365/202 |
| 2004/0073772 A1 | 4/2004 | Hokenek et al. ................ 712/1 |
| 2004/0105292 A1 | 6/2004 | Matsui ............................ 365/63 |
| 2004/0120197 A1 | 6/2004 | Kondo et al. ................. 365/202 |
| 2004/0120210 A1 | 6/2004 | Lee .............................. 365/232 |

(56) References Cited

U.S. PATENT DOCUMENTS

| | | | |
|---|---|---|---|
| 2004/0177210 A1 | 9/2004 | Choi | 711/5 |
| 2004/0221186 A1 | 11/2004 | Lee et al. | 713/300 |
| 2004/0225853 A1 | 11/2004 | Lee et al. | 711/168 |
| 2004/0256638 A1 | 12/2004 | Perego | 257/200 |
| 2005/0015539 A1 | 1/2005 | Horii et al. | |
| 2005/0083721 A1 | 4/2005 | Hampel | 365/145 |
| 2005/0152210 A1 | 7/2005 | Park et al. | 365/233 |
| 2005/0182885 A1 | 8/2005 | Matsui et al. | 710/307 |
| 2006/0004976 A1 | 1/2006 | Rader | 711/167 |
| 2006/0039227 A1 | 2/2006 | Lai | 365/230.03 |
| 2006/0047899 A1 | 3/2006 | Ilda et al. | 711/113 |
| 2006/0067146 A1 | 3/2006 | Woo | 365/206 |
| 2006/0072366 A1 | 4/2006 | Ware | 365/230.06 |
| 2007/0268765 A1 | 11/2007 | Woo | 365/207 |
| 2008/0028135 A1* | 1/2008 | Rajan et al. | 711/106 |
| 2008/0062807 A1 | 3/2008 | Ware | 365/230.06 |
| 2009/0157994 A1 | 6/2009 | Hampel | 711/168 |
| 2010/0211748 A1 | 8/2010 | Perego | 711/148 |

FOREIGN PATENT DOCUMENTS

| | | | |
|---|---|---|---|
| EP | 0887737 A2 | 12/1998 | G06F 13/40 |
| EP | 0910091 | 4/1999 | G11C 7/00 |
| EP | 1248267 A | 10/2002 | G11C 7/10 |
| GB | 2367400 A | 4/2002 | G06F 12/06 |
| JP | 07/262767 | 10/1995 | G11C 11/401 |
| JP | 10-172283 | 6/1998 | G11C 11/407 |
| JP | 2003-007052 | 1/2003 | G11C 11/401 |
| JP | 2004-005856 | 1/2004 | G11C 11/401 |
| JP | 2004139552 A2 | 5/2004 | G06F 13/16 |
| WO | WO 91-16680 | 10/1991 | G06F 13/16 |
| WO | WO 2004/034401 | 4/2004 | |
| WO | WO 2006-039106 | 4/2006 | G11C 8/12 |
| WO | WO 2009-089301 | 7/2009 | G06F 13/16 |

OTHER PUBLICATIONS

Yoo, et al., "A 150 MHZ 8-Banks 256M Synchronous DRAM with Wave Pipelining Methods," IEEE ISSCC, Digest of Technical Papers, p. 250-251, 374, Feb. 17, 1995.

Yoo et al., "17.7: A 1.8V 700Mb/s/pin 512Mb DDR-II SDRAM with On-Die Termination and Off-Chip Driver Calibration", ISSCC, Feb. 2003, pp. 312-313, 495, 250-251, 535. 6 pages.

Ware, Frederick A., Rambus, Inc., "Direct RDRAM 256/288-Mbit (512Kx16/18x32s) Data Sheet," Preliminary Information, Document DL0060 Version 0.90, 1999, pp. 1-66.

Nvidia Corporation, Technical Brief, "GeForce3: Lightspeed Memory Architecture," pp. 1-9. 11 pages.

Zhao, Cansang, Ta 11.6 "An 18Mb, 12.3GB/s CMOS Pipeline-Burst Cache SRAM with 1.54Gb/pin," Zhao, et al. IEEE International Solid-State Circuits Conference, 1999. 10 pages.

"The Authoritative Dictionary of IEEE Standards Terms," Copyright 2000, IEEE Press, Seventh Edition, p. 252.

Satoh et al., "A 209K-Transistor ECL Gate Array with RAM," IEEE Journal of Solid-State Circuits, vol. 24, No. 5, Oct. 1989, pp. 1275-1281.

"Memory CMOS 8 x 256K x 32 Bit Double Data Rate FCRAM, MB81N643289-50/-60," pp. 1-56, Fujitsu Semiconductor Data Sheet, Advance Info., AEO.5E. 57 pages.

Sugibayashi et al., "WP3.5: A 30ns 256Mb DRAM with Multi-Divided Array Structure", ISSCC Feb. 1993, pp. 50-51/262.

Saeki et al., "SP 23.4: A 2.5 ns Clock Access 250MHz 256Mb SDRAM with a Synchronous Mirror Delay," IEEE ISSCC Digest of Technical Papers, p. 374-375, 476, Feb. 10, 1996.

Yamashita et al., "FA 15.2: A 3.84 GIPS Integrated Memory Array Processor LSI with 64 Processing Elements and 2-Mb SRAM", IEEE International Solid-State Circuit Conference, pp. 260-261, Feb. 1994.

Micron, "Graphics DDR3 DRAM." Advance. "256 Mb x 32 GDDR3 DRAM." © 2003 Micron Technology, Inc. pp. 1-67. 67 pages.

"Design Optimization Techniques for Double Data Rate SDRAM Modules," Fairchild Semiconductor, Jul. 2000. 6 pages.

Nitta et al., "SP23.5: A 1.6GB/s Data-Rate 1Gb Synchronous DRAM with Hierarchical Square-Shaped Memory Block & Distributed Bank Architecture," IEEE ISSCC Digest of Technical Papers, p. 376-377, 477, Feb. 10, 1996.

Masumoto, Rodney T., "Configurable On-Chip RAM Incorporated Into High Speed Logic Array," Proceedings of the IEEE 1985 Custom Integrated Circuits Conference, May 20-23, 1985, pp. 240-243.

International Search Report and Written Opinion of the International Searching Authority in International Application PCT/US2005/032770, World Intellectual Property Organization, Jan. 26, 2006. 12 pages.

Sugibayashi et al., "A 30-ns 256-Mb DRAM with a Multidivided Array Structure", IEEE, Nov. 1993, pp. 1092-1098, vol. 28, No. 11.

Aimoto et al., "SP23.3 A 7168GIPS 3.84GB/s 1W Parallel Image-Processing RAM Integrating a 16Mb DRAM and 128 Processors", ISSCC, Feb. 1996, pp. 372-373/476.

"DRAM Data Book," Micron Technology, Inc. Preliminary 1997. 3 pgs. Cover/copyright info./listing of chapters, i-xxiv, 2 pages, 1-1 to 1-44. 71 pages.

Takase et al., "A 1.6-Gbyte/s DRAM with Flexible Mapping Redundancy Technique and Additional Refresh Scheme," IEEE Journal of Solid-State Circuits, vol. 34, No. 11, Nov. 1999, pp. 1600-1606. 7 pages.

Chang, Kun-Yung, "Design of a CMOS Asymmetric Serial Link," A Dissertation Submitted to the Department of Electrical Engineering and the Committee on Graduate Studies of Stanford University, Aug. 1999. 133 pages.

Yoo et al., "SP23.6 A 32-Bank 1Gb DRAM with 1GB/s Bandwidth", ISSCC,s Feb. 1996, pp. 378-379/477.

Giacalone et al., "SP23.2: A 1MB, 100MHz Integrated L2 Cache Memory with 128b Interface and ECC Protection," IEEE ISSCC, Feb. 1996, pp. 370-371/475.

Samsung Electronics, "SDRAM Device Operations", date unknown. 42 pages.

Sakata et al., "Two-Dimensional Power-Line Selection Scheme for Low Subthreshold-Current Multi-Gigabit DRAM's", IEEE Journal of Solid State Circuits, vol. 29, No. 8, Aug. 1994, pp. 887-893.

International Search Report and Written Opinion of the International Searching Authority in International Application PCT/US2005/028728, World Intellectual Property Organization, Dec. 23, 2005.

Session XVIII: Static RAMs, FAM 18.6: A 64Kb CMOS RAM, IEEE International Solid State Circuits Conference, 1982, pp. 258-259.

Konishi et al., "Session SVIII: Static RAMs—FAM18.6: A 64Kb COMOS RAM," ISSCC, Feb. 1982, pp. 258-259/333.

Koike et al., "SP23.1: A 60ns 1Mb Nonvolatile Ferroelectric Memory with Non-Driven Cell Plate Line Write/Read Scheme", ISSCC, Feb. 1996, pp. 368-379/475.

Kirihata et al., "A 390-mm2, 16-Bank, 1-Gb DDR SDRAM with Hybrid Bitline Architecture," IEEE Journal of Solid-State Circuits, vol. 34, No. 11, Nov. 1999, pp. 1580-1588.

Minutes of Meeting No. 70, JC-42.3 Committee on RAM Memories, Mar. 9, 1994, Orlando, Florida. 72 pages.

Micron Technology Inc., "Micron Synchronous DRAM 128Mb:x32 SDRAM," pp. 1-52, Rev. 9/00.

Nakamura et al., "FA14.2: A 29ns 64Mb DRAM with Hierarchical Array Architecture," ISSCC, Feb. 1995, pp. 246-247/373. 3 pages.

Hirose et al., "A 20-ns 4-Mb CMOS SRAM with Hierarchical Word Decoding Architecture," IEEE, Oct. 1990, pp. 1068-1072, vol. 25, No. 5.

Takase et al., "WP 24.1 A 1.6GB/s DRAM with Flexible Mapping Redundancy Technique and Additional Refresh Scheme," ISSCC99/Session 24/Paper, Toshiba Corp., WP 24.1, Feb. 17, 1999. 2 pages.

"256Mb: x32 Graphics DDR3 DRAM MT44H8M32—2 MEG x 32 x 4 Banks", GDDR3_1.fm—Rev A, Micron Technology, Jun. 2003. 68 pages.

Jedec, "Minutes of Meeting No. 71, JC-42.3 Committee on RAM Memories," including Proposal to Add Number of Banks Option to the Mode Register for 64M SDRAM, Joint Electron Device Engineering Council (JEDEC), May 25, 1994, New York, pp. 1-14 plus Attachment T. 8 pages.

(56) References Cited

OTHER PUBLICATIONS

Fujisawa et al., "An 8.4ns Column-Access 1.3Gb/s/pin DDR3 SDRAM with an 8:4 Multiplexed Data-Transfer Scheme," Feb. 7, 2006, IEEE International Solid-State Circuits Conference, Session 8, DRAM and TCAM, 8.4. 10 pages.
International Preliminary Report on Patentability and Written Opinion of the International Searching Authority in International Application PCT/US2005/042722, World Intellectual Property Organization, Jun. 7, 2007, 10 pages.
International Preliminary Report and Written Opinion in International Application No. PCT/US/2005/032770, dated Apr. 12, 2007. 6 pages.
International Search Report and Written Opinion in International Application No. PCT/US2005/042722, dated May 10, 2006. 15 pages.
Takase et al., "WP 24.1 A 1.6GB/s DRAM with Flexible Mapping Redundancy Technique and Additional Refresh Scheme," IEEE International Solid-State Circuits Conference, 4 pages plus ISSCC Slide Supplement pp. 348-349 and 506-507, 1999.
Micron Technology, Inc., "Synchronous DRAM," Rev. Apr. 1996.
Invitation to Pay Additional Fees from the International Searching Authority in International Application PCT/US2007/067814, dated Dec. 17, 2007. 8 pages.
International Search Report and the Written Opinion for International Application No. PCT/US2007/067814, dated Feb. 29, 2008. 18 pages.
Application as filed on Apr. 17, 2007, U.S. Appl. No. 09/837,307. 54 pages.
International Search Report and Written Opinion in International Application No. PCT/US/2005/032770, dated Jan. 26, 2006. 12 pages.
First Office Action dated Jul. 27, 2009, for the Chinese Patent Application No. 200580045523.7.
Official Communication with Extended European Search Report for EP Application No. 09167223.8-1233, dated Oct. 6, 2009. 8 pages.
Response to Office Action with mail date of May 5, 2009 re U.S. Appl. No. 11/767,863, filed Jun. 25, 2007. Amendment was submitted to the USPTO on Oct. 5, 2009. 20 pages.
Fist EP Examination Report with mail date of Oct. 5, 2009, re EP Application No. 07 782 931.5-1233. 5 pages.
Hampel, Craig, U.S. Appl. No. 11/381,349, filed May 2, 2006, re Reply Brief in Response to Examiner's Answer mailed Feb. 8, 2010. 6 pages.
Ware, Frederick, U.S. Appl. No. 10/998,402, filed Nov. 29, 2004, re Appeal Brief mailed Apr. 6, 2010. 28 pages.
Ware, Frederick, U.S. Appl. No. 11/767,863, filed Jun. 25, 2007, re Office Action mailed Apr. 7, 2010. 3 pages.
International Preliminary Report on Patentability (Chapter II) with mailing date of Apr. 9, 2010 re Int'l. Application No. PCT/US07/67814. 7 pages.
EP Response dated Apr. 15, 2010 to the Official Communication dated Oct. 5, 2009 re EP Application No. 07783931.5-1233. 25 pages.
Ware, Frederick, U.S. Appl. No. 11/767,863, filed Jun. 25, 2007, re Response After Final Office Action mailed Mar. 24, 2010. 15 pages.
Office Communication with mail date Mar. 29, 2010, re Board of Patent Appeals and Interferences Docketing Notice (Appeal No. 2010-005060). 2 pages.
CN Office Action dated Mar. 24, 2010 re CN Application No. 200580045523.7, includes Text of the Second Office Action and Translation. 14 pages.
Amendment and Response dated Apr. 20, 2010 re U.S. Appl. No. 12/392,071. 12 pages.
Ware, Frederick, U.S. Appl. No. 11/767,863, filed Jun. 25, 2007, re Final Office Action mailed Mar. 1, 2010. 17 pages.
Non-Final Office Action with mail date of Mar. 1, 2010 re U.S. Appl. No. 12/392,071. 13 pages.
CN Response dated Jun. 3, 2010 re CN Patent Application No. 200580045523.7. 11 pages.
Ware, Frederick, U.S. Appl. No. 10/998,402, filed Nov. 29, 2004, re Office Action mailed Jul. 9, 2010. 17 pages.
Final Office Action with mail date of Jul. 7, 2010 re U.S. Appl. No. 12/392,071. 15 pages.
Office Communication with mail date of Mar. 29, 2010 re Board of Patent Appeals and Interferences Docketing Notice (Appeal No. 2010-005060). 2 pages.
International Preliminary Report on Patentability with mailing date of Apr. 9, 2010 re Int'l. Application No. PCT/US07/67814. 7 pages.
EP Communication pursuant to Article 94(3) EPC, dated Jul. 30, 2010 in EP Application No. 05852108.8-2210. 6 pages.
Ware, Frederick, U.S. Appl. No. 11/767,863, filed Jun. 25, 2007, re Notice of Appeal from the Examiner to the Board of Patent Appeals and Interferences, dated Jul. 30, 2010. 1 page.
Ware et al., U.S. Appl. No. 12/391,873, filed Feb. 24, 2009, re Notice of Allowance and Fee(s) Due mailed Aug. 31, 2010. 10 pages.
Ware, Frederick, U.S. Appl. No. 10/998,402, filed Nov. 29, 2004, re Notice of Appeal mailed Oct. 11, 2010. 1 page.
Communication Regarding the Expiry of the Time Limit Within Which Notice of Opposition May be Filed, dated Sep. 15, 2010 in EP Application No. 05799571.4-2210. 1 page.
Ware et al., U.S. Appl. No. 12/391,873, filed Feb. 24, 2009, re Notice of Allowance and Fee(s) Due mailed Nov. 3, 2010. 11 pages.
Ware, Frederick, U.S. Appl. No. 11/767,863, filed Jun. 25, 2007, re Response to Notice of Appeal submitted Dec. 24, 2010. 18 pages.
Response dated Jan. 7, 2011 to the Notice of Appeal filed Oct. 7, 2010 re U.S. Appl. No. 12/392,071, Includes Request for Continued Examination. 15 pages.
Ware, Frederick, U.S. Appl. No. 10/998,402, filed Nov. 29, 2004, re Notice of Appeal mailed Jan. 11, 2011. 10 pages.
EP Office Communication dated Nov. 24, 2010 re EP Application No. 09167223.8. 6 pages.
CN Office Action dated Dec. 22, 2010 re Rejection Decision for CN Application No. 200580045523.7. 14 pages.
EP Response dated Feb. 3, 2011 to the Official Communication dated Jul. 30, 2010 re EP Application No. 05852180.8. 33 pages.
Ware, Frederick, U.S. Appl. No. 10/998,402, filed Nov. 29, 2004, re Office Action mailed Feb. 8, 2011. 3 pages.
Ware, Frederick, U.S. Appl. No. 10/998,402, filed Nov. 29, 2004, re Response to Notice of Appeal mailed Feb. 2, 2011. 1 page.
Hampel, Craig, U.S. Appl. No. 12/392,071, filed Feb. 24, 2009, re Office Action with mail date of Feb. 17, 2011. 19 pages.
Ware, Frederick, U.S. Appl. No. 13/019,785, filed Feb. 2, 2011, re Response dated Mar. 12, 2011 to the Office Action dated Feb. 16, 2011, Includes Replacement Figures. 5 pages.
Ware, Frederick, U.S. Appl. No. 11/767,863, filed Jun. 25, 2007, re Office Action mailed Mar. 10, 2011. 23 pages.
Ware, Frederick, U.S. Appl. No. 10/998,402, filed Nov. 29, 2004, re Office Action mailed Mar. 11, 2011. 37 pages.
EP Response dated Apr. 4, 2011 to the Official Communication dated Nov. 24, 2010 re EP Application No. 09167223.8, Includes New Claims (Highlighted & Clear Copy) and Cross-Reference of New Claims. 41 pages.
Response dated May 17, 2011 to the Office Action mailed Feb. 17, 2011 re U.S. Appl. No. 12/392,071. 26 pages.
Ware et al., U.S. Appl. No. 13/019,785, filed Feb. 2, 2011, re Notice of Allowance and Fee(s) Due mailed Jun. 29, 2011. 14 pages.
Zheng et al., "Decoupled DIMM: Building High-Bandwidth Memory System Using Low-Speed DRAM Devices," ISCA '09, dated Jun. 20-24, 2009. 12 pages.
Ware, Frederick, U.S. Appl. No. 10/998,402, filed Nov. 29, 2004, re Amendment/Response to Office Action submitted Aug. 4, 2011. 12 pages.
Elpida Memory Inc., "User's Manual: New Features of DDR3 SDRAM," Document E1503E10 (Ver.1.0), published Mar. 2009. 18 pages.
Ware et al., "Micro-threaded Row and Column Operations in a DRAM Core," Rambus White Paper, Mar. 2005. 7 pages.
Malviya et al., "Module Threading Technique to Improve DRAM Power and Performance," D&R Industry Articles, dated Mar. 11, 2011, Copyright 2009. 9 pages.
Rambus Inc., "Micro-Threading", dated Apr. 3, 2011, found online at rambus.com/in/ . . . /microthreading.html. 4 pages.

(56) References Cited

OTHER PUBLICATIONS

Schuette, Michael, "Rambus/Kingston Threaded DDR3 Modules," dated Oct. 8, 2009, last updated Oct. 24, 2009. 8 pages.
Micron, "Designing for High-Density DDR2 Memory," Technical Note, TN-47-16, Rev. B., Dec. 2009. 10 pages.
Notice of Allowance and Fee(s) Due dated Aug. 4, 2011 re U.S. Appl. No. 12/392,071. 22 pages.
Ware, Frederick, U.S. Appl. No. 11/767,863, filed Jun. 25, 2007, re Response to Office Action mailed Mar. 10, 2011. 15 pages.
JP Office Action dated Oct. 27, 2011 re JP Application No. 2007-543517, translation included. 18 pages.
Ware, Frederick, U.S. Appl. No. 13/239,846, filed Nov. 15, 2011, re Preliminary Amendment submitted Nov. 16, 2011, Includes Terminal Disclaimer(s). 19 pages.
Ware, Frederick, U.S. Appl. No. 10/998,402, filed Nov. 29, 2004, re Final Office Action mailed Nov. 23, 2011. 33 pages.
Ware, Frederick, U.S. Appl. No. 11/767,863, filed Jun. 25, 2007, re Final Office Action mailed Nov. 25, 2011. 30 pages.
CN Board Opinion dated Dec. 1, 2011 re CN Application No. 200580045523.7. 8 pages.
EP Extended Search Report dated Dec. 30, 2011 re EP Application No. 11184623.4. 9 pages.
EP Extended Search Report dated Dec. 30, 2011 re EP Application No. 11179126.5. 10 pages.
EP Extended Search Report dated Jan. 2, 2012 re EP Application No. 11184627.5. 7 pages.
EP Summons to Attend Oral Proceedings re EP Application No. 09167223.8 dated Jan. 31, 2012. 8 pages.
EP Submission dated Feb. 3, 2012 in Response to the Official Communication dated Jan. 31, 2012 re EP Application No. 09167223.8. 4 pages.
Ware, Frederick, U.S. Appl. No. 10/998,402, filed Nov. 29, 2004, re Response submitted Feb. 22, 2012 to the Office Action of Nov. 23, 2011, Includes Request for Continued Examination. 21 pages.
Ware, Frederick, U.S. Appl. No. 13/239,846, filed Sep. 22, 2011, re Notice of Allowance and Fee(s) Due mailed Dec. 6, 2011. 47 pages.
Ware, Frederick, U.S. Appl. No. 13/239,846, filed Sep. 22, 2011, re Corrected Notice of Allowability mailed Jan. 17, 2012. 5 pages.
Ware, Frederick, U.S. Appl. No. 10/998,402, filed Nov. 29, 2004, re Corrected Response submitted Feb. 22, 2012 to the Office Action of Nov. 23, 2011. 17 pages.
EP Office Action dated Feb. 6, 2012 re EP Application No. 11179126.5. 2 pages.
EP Office Communication dated Jan. 11, 2012 re EP Application No. 07782931.5. 7 pages.
Ware, Frederick, U.S. Appl. No. 10/998,402, filed Nov. 29, 2004, re Office Action mailed Mar. 21, 2012. 36 pages.
Ware, Frederick, U.S. Appl. No. 11/767,863, filed Jun. 25, 2007, re Office Action mailed Mar. 22, 2012. 34 pages.
EP Office Action dated Mar. 23, 2012 re EP Application No. 05852180.8. 5 pages.
EP Extended European Search Report dated Mar. 28, 2012 re EP Application No. 11168736.4. 11 pages.
EP Extended European Search Report dated Mar. 27, 2012 re EP Application No. 11168735.6. 9 pages.
EP Extended European Search Report dated Mar. 27, 2012 re EP Application No. 11168734.9. 9 pages.
JP Response dated Apr. 26, 2012, re Argument and Amendment to the Office Action dated Oct. 27, 2011 in JP Application No. 2007-543517. 21 pages.
KR Office Action dated May 9, 2012 re KR Application No. 2007-7014584. 4 pages.
EP Summons to Attend Oral Proceedings dated Apr. 27, 2012 re EP Application No. 09167223.8. 1 page.
JP Office Action dated Jun. 19, 2012 for JP Application No. 2009-510005. 3 pages.
EP Response dated Jul. 20, 2012 to the Official Communication dated Jan. 11, 2012 in EP Application No. 07782931.5-1233, Includes New Claims (Clear and Highlighted Copies). 23 pages.
EP Response dated Jul. 30, 2012 to the Official Communication dated Feb. 6, 2011 and the extended European Search Report dated Dec. 30, 2011, in EP Application No. 11 179 126.5, Includes New Claims (Clear and Highlighted Copies). 26 pages.
EP Response dated Jul. 30, 2012 In response to the Official Communication dated Feb. 6, 2012 and to the Extended European Search Report dated Dec. 30, 2012, in EP Application No. 11 184 623.4, Includes New Claims (Clear and Highlighted Copies). 29 pages.
EP Response dated Jul. 30, 2012 in Response to the Official Communication dated Feb. 6, 2012 and to the Extended European Search Report dated Dec. 30, 2012, in EP Application No. 11 184 627.5, Includes New Description pp. 2, 2a, and 22. 16 pages.

\* cited by examiner

MEMORY SIGNAL BUFFERS AND MODULES SUPPORTING VARIABLE ACCESS GRANULARITY

TECHNICAL FIELD

The subject matter presented herein relates generally to high-speed electronic signaling in support of memory access.

BACKGROUND

Processing units execute instructions to read, manipulate, and write data. Both the instructions and data are commonly stored in a separate memory, which is coupled to the processing unit via a communication channel, or memory channel. Memory controller logic integrated with the processing unit or on a separate integrated circuit (IC) manages the flow of instructions and data between the processing unit and memory. In a common example, a typical personal computer includes a central processing unit (CPU), a quantity of dynamic, random-access memory (DRAM), and a memory controller IC that manages the flow of information between the CPU and DRAM.

The speed with which a processing unit can execute instructions is limited by the speed with which it can communicate with the memory. This communication speed is limited by (1) the "interface speed," which is a measure of how fast the information can be passed to and from the memory; and (2) the memory's "core speed," or how quickly the memory can write and read information responsive to instructions from the memory controller.

Interface speeds have improved far more rapidly than DRAM core speeds. As a consequence, DRAM core speeds have become a limiting factor in further improvements in speed performance. To address this bottleneck, new generations of DRAM devices simply read or write more information for each memory access. If the interface speed were to double without a commensurate improvement in core performance, for example, one might simply double the amount of information read or written for each memory access (i.e., double the "access granularity").

Unfortunately, certain classes of applications do not require high access granularity. DRAMs thus tend to access more information than is needed, which wastes power and reduces speed/performance. Energy efficiency and speed performance are design concerns in all forms of computing devices.

One solution to increasing memory access granularity is called "threading." This technique permits a single, relatively wide memory channel to be divided into two or more subchannels that convey relatively narrow memory "threads." Memory threading reduces access granularity while maintaining or increasing access speeds, and in doing so reduces power consumption. Incompatibility with older "legacy" memory controllers and memory devices may slow the adoption of this important technology.

BRIEF DESCRIPTION OF THE FIGURES

The present invention is illustrated by way of example, and not by way of limitation, in the figures of the accompanying drawings and in which like reference numerals refer to similar elements and in which:

FIG. 6 details an embodiment of signal buffer 125 of FIG. 1, with like-identified elements being the same or similar.

DETAILED DESCRIPTION

Figure 1:
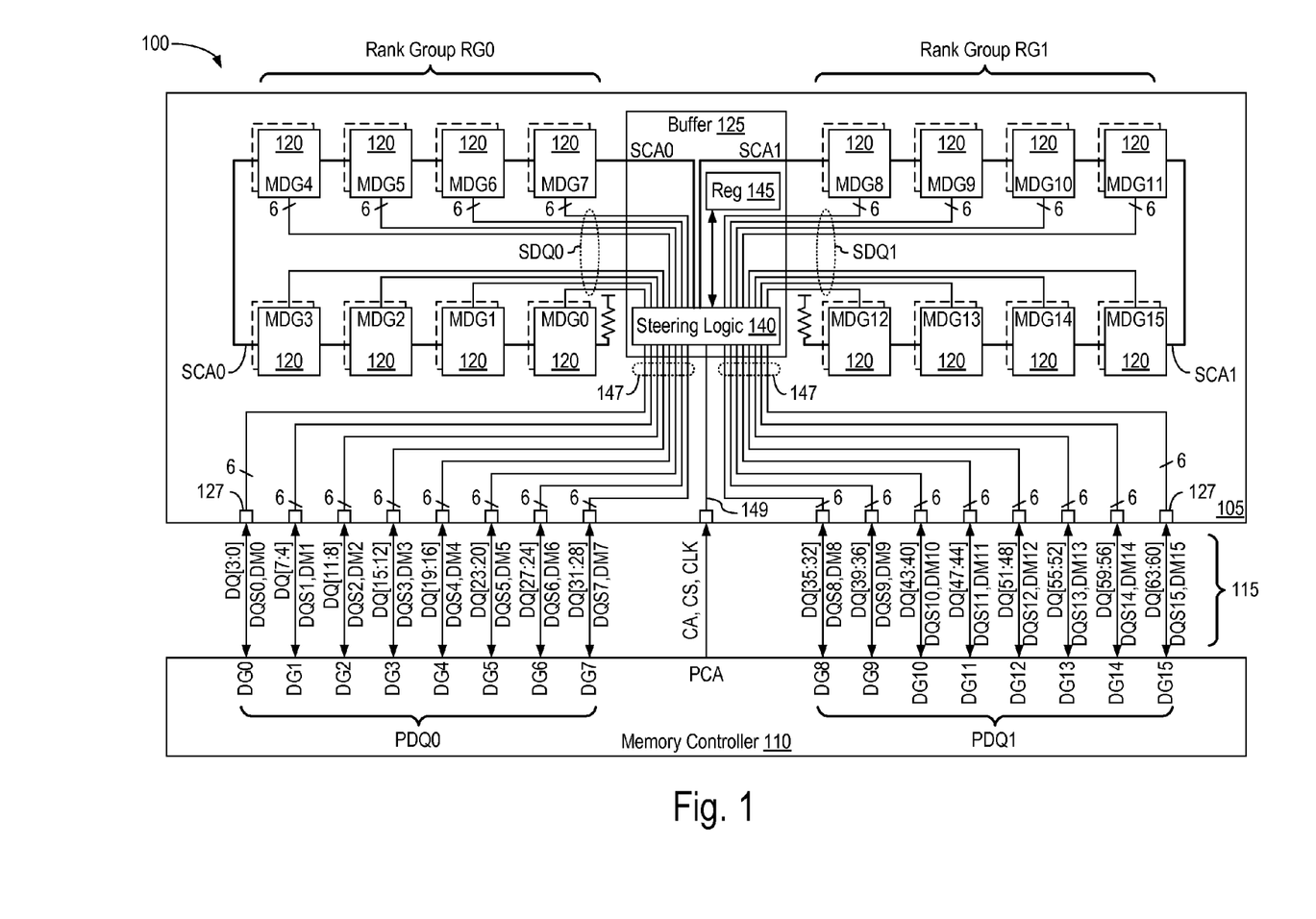
FIG. 1 depicts a memory system 100, including a memory module 105 and a memory controller 110 interconnected via an interface 115.

FIG. 1 depicts a memory system 100, including a memory module 105 and a memory controller 110 interconnected via an interface 115. System 100 typically resides on a motherboard, and memory controller 110 can be a discrete integrated circuit (IC) or can be integrated with e.g. a CPU. Memory module 105 includes two independently accessible rank groups RG0 and RG1. Each rank group, in turn, includes two ranks of eight memory devices 120 each, one rank on each side of memory module 105. The memory devices of the backside ranks are indicated using dashed boundaries. In this context a "rank" refers to a set of separately addressable memory devices used for a single memory access. Memory module 105 additionally includes a configurable signal buffer 125 that manages communication between memory devices 120 and memory controller 110. Signal bugger 125 can be configured such that memory module 105 supports threading.

Module support for threading, called "module threading," minimizes or eliminates the need to modify legacy memory controllers to facilitate threading. In some embodiments memory controller 110 issues commands (memory requests) to memory module 105 requesting a column access (read or write) of a specified granularity (e.g., 64-byte column accesses). Signal buffer 125 translates each of these controller commands into two serial subcommands, each requesting a column access of half the specified granularity (e.g., two 32-bye column accesses). Signal buffer 125 directs the two subcommands to a single rank within one of rank groups RG0 and RG1. The targeted rank then serially communicates the two requested column accesses to or from signal buffer 125. In the case of a read access, for example, signal buffer 125 combines the read data from two 32-byte column accesses from the same rank into 64-byte data, and then transmits the 64-byte data to memory controller 110 via interface 115 to comply with the original 64-byte controller command. System 100 can thus support threading where memory controller 110 cannot. Signal buffer 125 can likewise minimize or eliminate any changes that might otherwise be required of the memory devices in support of threading.

Memory controller 110 issues commands to memory module 105 via a primary command interface PCA, which conventionally conveys e.g. read and write commands CA, one or more chip-select signals CS, and a timing reference such as a clock or strobe. In some embodiments memory controller 110 forwards a data clock signal to each memory device 120 via signal buffer 125 and receives a Timing Reference Signal (TRS) from each memory device during Read and Write operations.

Memory controller 110 additionally includes two primary data groups PDQ[1:0], each of which respectively includes eight data groups DG[15:8] and DG[7:0]. Each data group is connected to memory module 105 via a respective communication channel within interface 115. An individual data group includes four data bits DQ, a data-strobe bit DQS, and a data-mask bit DM in this embodiment. There being sixteen data groups DG[15:0], interface 115 communicates sixty-four data bits, sixteen strobe bits, and sixteen mask bits in parallel. Data-group signals can be, e.g., single-ended or differential, and more, fewer, or different signals can accompany the data signals in each data group. For ease of illustration, the six signal channels supporting each data group are depicted using a single bi-directional signal path through a respective module connection 127.

Signal buffer 125 includes steering logic 140 and a related register 145. Steering logic 140 supports a module data interface 147 coupled to data groups DG[15:0] of interface 115 to communicate module data, and a pair of memory data interfaces SDQ[1:0] coupled to respective rank groups RG[1:0] to communicate memory data. In this embodiment, each of memory devices 120 includes eight banks and supports a memory data group MDG# that includes the same number of signal lines and supports e.g. the same signals and signaling schemes as each data group DG[15:0] on memory controller 110. In the depicted embodiment, each rank within each rank group RG[1:0] includes eight four-bit-wide memory devices, so the data width N from each rank group is thirty-two bits. Signal buffer 125 combines data from the two rank groups to communicate data of width 2N, or sixty-four bits, over module data interface 147. Other embodiments support more data widths, different data widths, or both.

Signal buffer 125 additionally includes a module command interface 149 coupled to primary command interface PCA and a pair of memory command interfaces SCA[1:0]. Responsive to module commands received via primary command interface PCA of memory controller 110, signal buffer 125 issues memory commands to either or both of rank groups RG[1:0] via respective secondary command interfaces SCA[1:0]. Signal buffer 125 is thus able to manage the flow of information between memory devices 120 and memory controller 110. In this example, each rank group includes sixteen memory devices 120, a rank of eight on either side of memory module 105 (the backside devices are indicated with dashed boundaries). As discussed below in detail, steering logic 140 can control both rank groups RG[1:0] together to support relatively wide, 64-byte memory accesses, or can control the rank groups separately to support relatively narrow 32-byte accesses. Steering logic 140 can also, e.g., modify burst length M and reorder data bits in some embodiments.

Figure 2:
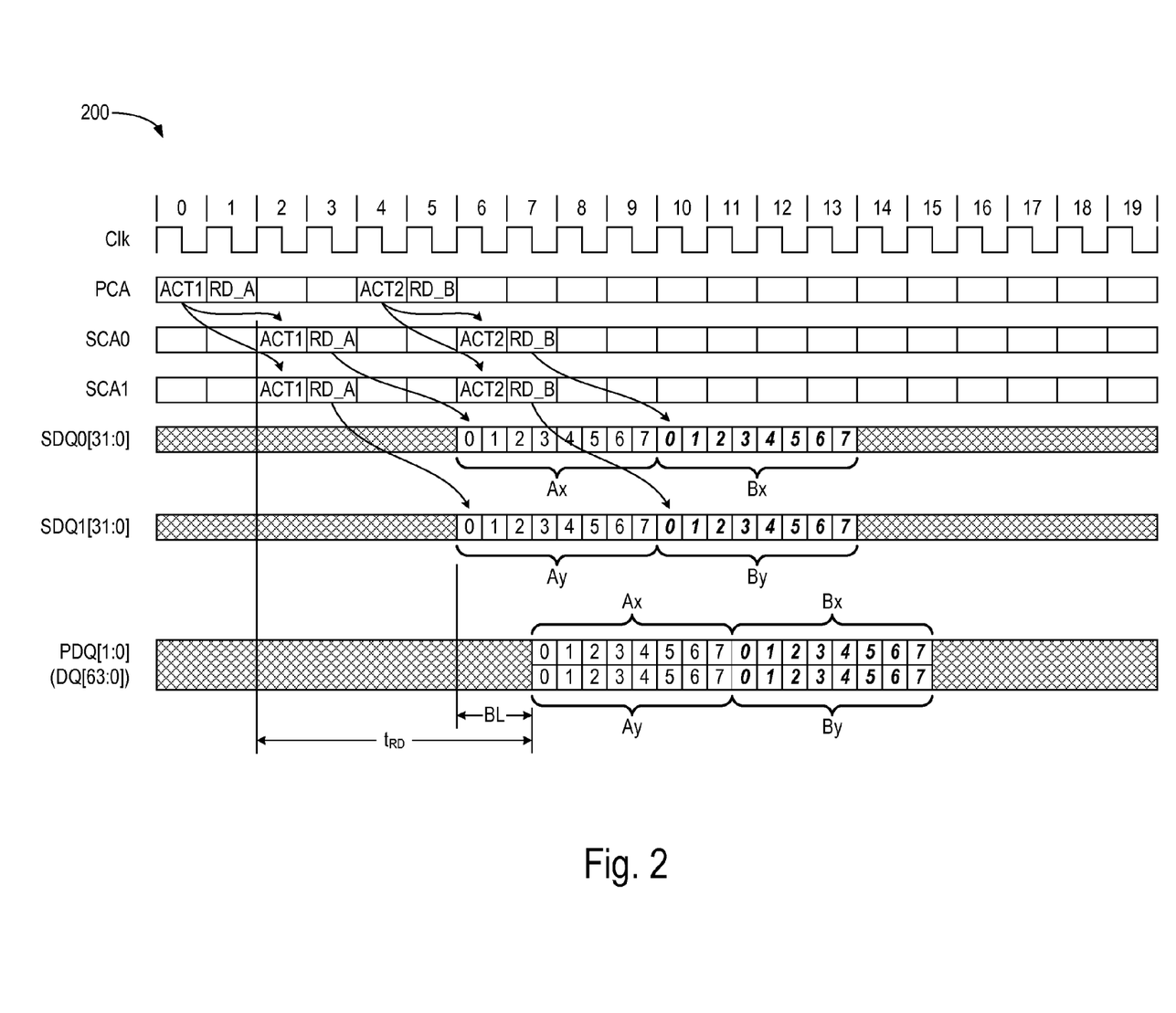
FIG. 2 is a timing diagram 200 for signals in memory system 100 of FIG. 1 when signal buffer 125 is configured to provide 64-byte access granularity as 64 eight-bit bursts on data lines DQ[63:0] of data groups DG[15:0] in accordance with an embodiment.

FIG. 2 is a timing diagram 200 for signals in memory system 100 of FIG. 1 when signal buffer 125 is configured to provide 64-byte access granularity as 64 eight-bit bursts on data lines DQ[63:0] of data groups DG[15:0] in accordance with an embodiment. This configuration can be used in support of legacy communication schemes. In one embodiment, the depicted configuration supports, in one mode, the external functionality provided by conventional LRDIMM memory modules.

FIG. 2 illustrates two consecutive read accesses, one to a first column address "A" and another to a second column address "B," both timed with respect to a clock signal Clk. This illustration relates to a double-data-rate (DDR) system, so one period of clock signal Clk is equal to two bit times on the data interfaces. Each waveform of FIG. 2 is named for its corresponding interface in FIG. 1. Whether a given reference is to a signal or the associated interface will be clear in context.

Returning to FIG. 1, steering logic 140 relays module commands from primary command interface PCA to both rank groups RG[1:0], and buffers signals between each of data groups DG[15:0] and a respective one of memory data groups MDG[15:0]. One or more chip-select CS or other address or control signals on command interface PCA selects between ranks (e.g., between the ICs on the front and back of memory module 105) and rank groups to communicate data over secondary data-group interfaces SDQ[1:0]. In some embodiments signal buffer 125 is programmable to select which control signal or signals distinguish between ranks and/or ranks groups. Control signals can be time multiplexed. In one embodiment, for example, one of two memory devices sharing a common chip-select line can be programmed to wait one command time slot before responding to the chip-select. A single chip-select signal can thus be used to successively access two (or more) devices or sets of devices.

Memory controller 110 initiates the first read access by issuing an activate command ACT1 on interface PCA to activate an addressed row of memory cells. The activate command is quickly followed by a read command RD_A specifying a read access and the column address from which the data is to be read. Signal buffer 125 relays both the activate and read commands to both rank groups RG[1:0] via respective secondary command interfaces SCA[1:0]. In response, one rank of eight memory devices from each of rank groups RG[1:0] returns the requested data to signal buffer 125 via respective memory data groups MDG[15:8] and MDG[7:0] and over secondary data interfaces SDQ[31:0]. The command pair ACT1/RD_A thus retrieves column accesses Ax and Ay, each thirty-two bits wide by eight bits long, from respective rank groups RG0 and RG1; the subsequent command pair ACT2/RD_B similarly retrieves column accesses Bx and By from respective rank groups RG0 and RG1. Signal buffer 125 combines column accesses Ax with Ay and Bx with By and presents them to primary data groups PDQ[1:0] as successive sixty-four (16×4) parallel eight-bit bursts. From the controller perspective, the access granularity is 64 bytes.

The read delay $t_{RD}$ from receipt of the read command RD_A to receipt of data on primary data interface PDQ[1:0] includes a buffer delay BL imposed by signal buffer 125. While all delays are undesirable, signal buffer 125 minimizes signal loading on interface 115, and thus allows multiple modules to share interface 115 to memory controller 110. The relatively small buffer delay therefore facilitates expansion of memory capacity.

Each activate command ACT causes recipient memory devices to sense and store the contents of an addressed row of memory cells, in which case the activated row is said to be "open." A subsequent read (or write) command then selects a subset of the open row, a "column." The row can remain open for any number of subsequent column accesses to the same row. Accessing a different row requires the open row be closed and the next row opened, both of which operations consume power. As a consequence, successive accesses to different rows consume considerably more power than successive accesses to different columns in the same row. Moreover, repeated row accesses can cause localized heating, which tends to reduce reliability and life expectancy of memory devices. Some memory systems therefore limit the frequency of row accesses to prevent excessive heat buildup.

In one embodiment, for example, memory devices 120 comply with the DDR3 standard specified by the JEDEC Solid State Technology Association as JESD79-3D. The DDR3 specification defines a time period $t_{FAW}$, for "time four-access window." Memory devices that comply with the DDR3 standard must limit the number of row accesses that takes place over a 30 ns window to four. While preventing overheating and reducing on-chip voltage noise, the $t_{FAW}$ restriction also introduces delays that prevent memory system 100 from realizing its full performance potential. It is therefore desirable to minimize successive row accesses in favor of successive column accesses to the same row.

Figure 3:
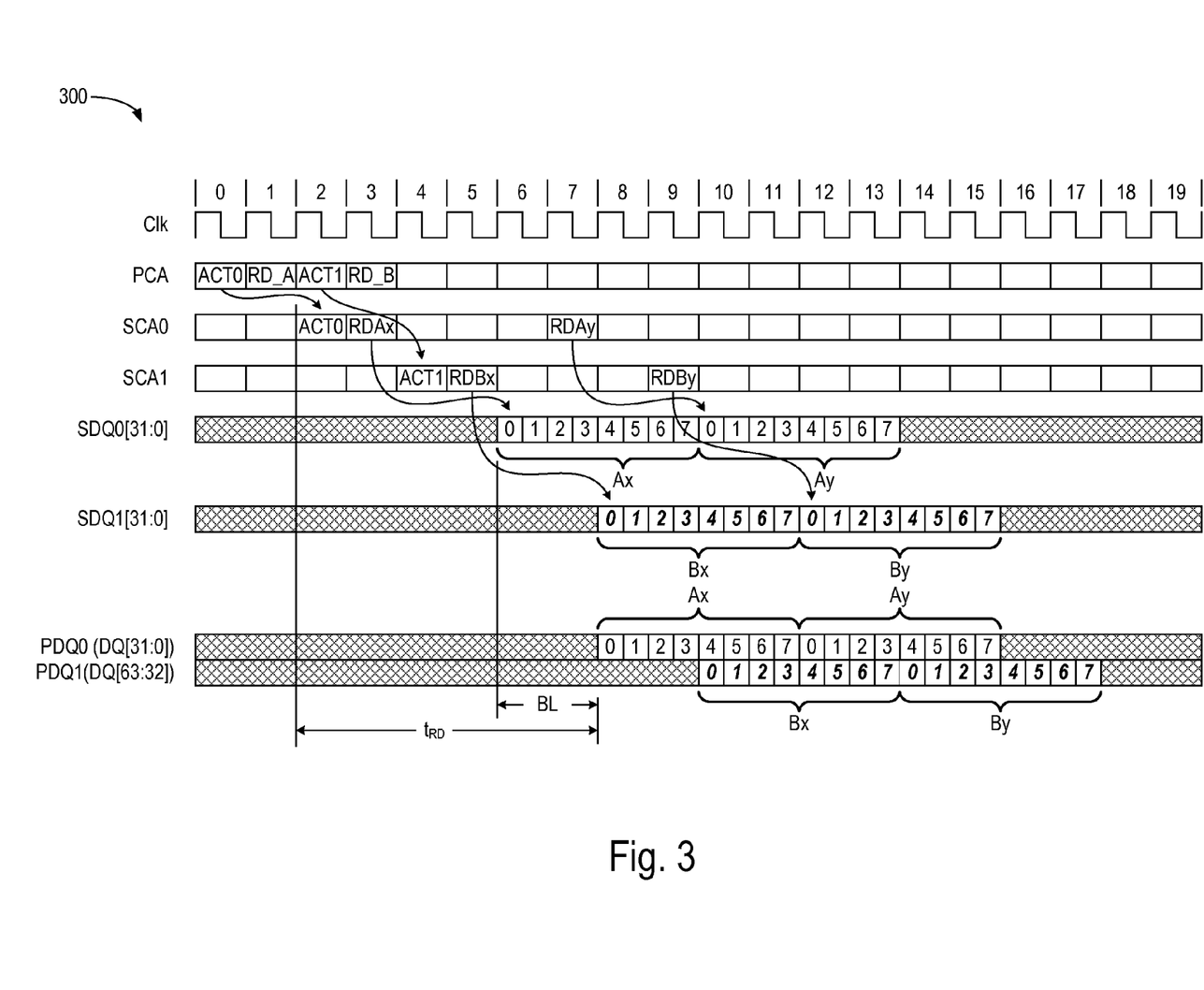
FIG. 3 is a timing diagram 300 for signals in memory system 100 of FIG. 1 when signal buffer 125 is configured to support threading.

FIG. 3 is a timing diagram 300 for signals in memory system 100 of FIG. 1 when signal buffer 125 is configured to support threading. This threading mode reduces the frequency of row activations in favor of successive column accesses. The reduced frequency of row activations reduces power consumption and improves speed/performance. Also important, signal buffer 125 reduces the frequency of memory sequences that would cause memory system 100 to violate the $t_{FAW}$ window. In some embodiments these performance benefits are achieved with little or no change to the memory controller.

In the configuration of FIG. 3, and with reference to FIG. 1, steering logic 140 directs activate commands ACT received on primary command interface PCA to either of rank groups RG0 or RG1 depending upon, e.g., the specified row address, one or more asserted chip select signals, or another control signal or signals. In this example, steering logic 140 directs a first memory-access command ACT0 to rank group RG0 via secondary command interface SCA0, and directs a second memory-access command ACT1 to rank group RG1 via secondary command interface SCA1. Steering logic 140 divides the read request associated with each activate command into two separate and temporally spaced secondary read requests specifying respective columns within the active row. Read request RD_A (a read request to column A) is divided, for example, into a pair of secondary read requests RDAx and RDAy that specify respective columns x and y. Responsive to those requests, a memory rank in rank group RG0 returns two successive column accesses Ax and Ay, each of which includes thirty-two parallel eight-bit bursts (32 bytes) of data. Steering logic 140 likewise divides read request RD_B into a pair of secondary read requests RDBx and RDBy to obtain two successive column accesses Bx and By. Steering logic 140 then conveys column accesses Ax, Bx, Ay, and By as shown to memory controller 110 via primary data pins PDQ0[31:0] and PDQ1[31:0]. Column accesses on the low-order half PDQ0 of the primary data interface (e.g., Ax and Ay) represent one module thread, and column accesses on the high-order half PDQ1 (e.g., Bx and By) represent another.

The read delay $t_{RD}$ is similar to that of the embodiment of FIG. 2, but the first data to arrive on the low-order half PDQ0 of the primary data interface arrives two clock cycles (four bit times) before data begins to arrive on the high-order half PDQ1. The two secondary addresses specify different columns within the same row, and are conveyed sequentially over sixteen bit times. Row accesses to a given memory device are thus spaced by at least sixteen bit times. In a DDR3 system, this provides an efficient command sequence without any $t_{FAW}$ violations and their attendant delays. The overall frequency of row activations is also reduced, which further saves power and improves speed/performance.

Signal buffer 125 derives two read addresses, both to the same row, for each read command on primary command interface PCA in the foregoing example (e.g., signal buffer 125 derives commands RDAx and RDAy from RD A). In other embodiments memory controller 110 can generate commands RDAx and RDAy directly. Such embodiments can support reduced access granularity, but may require increased controller complexity and bandwidth on the primary command interface.

Figure 4:
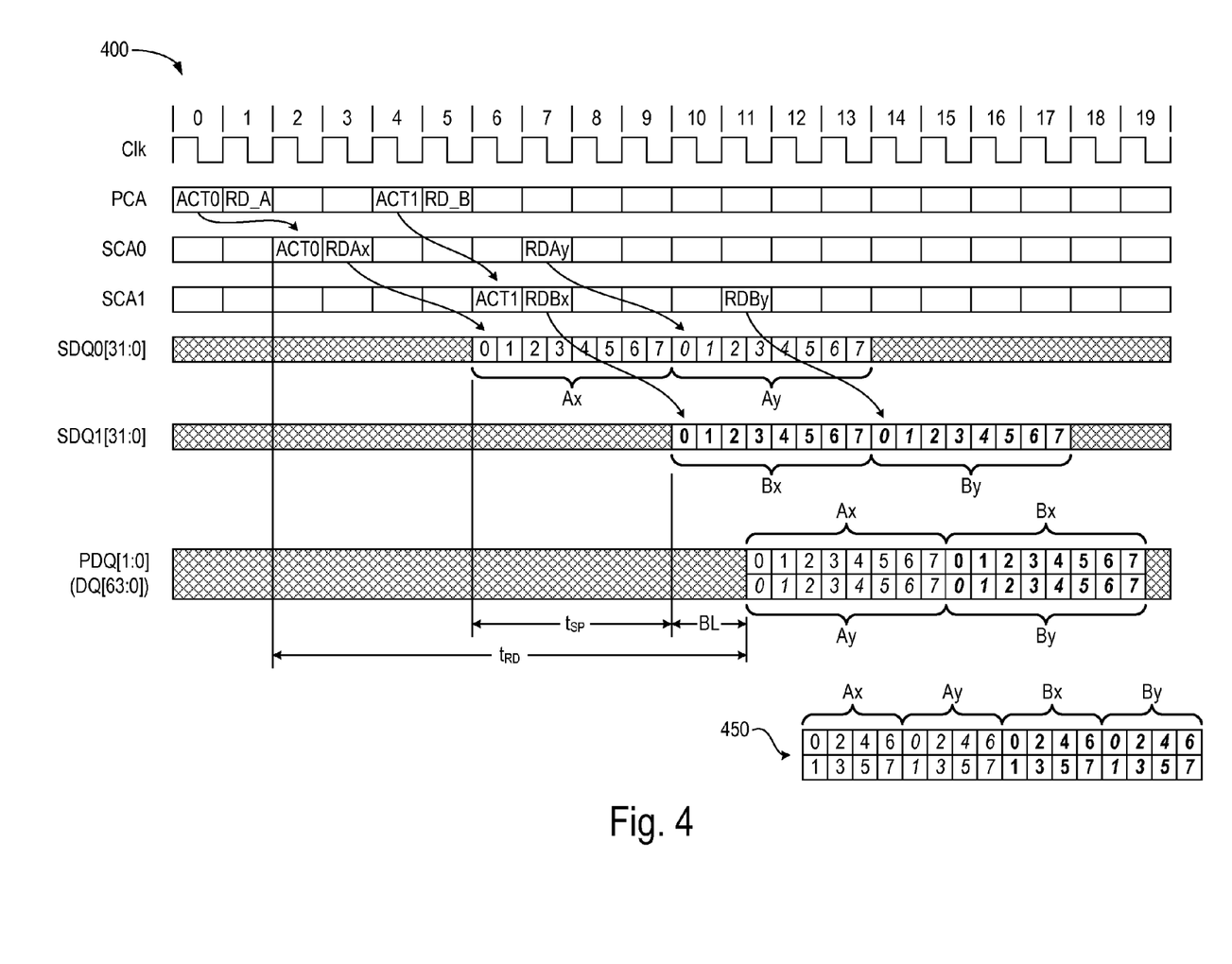
FIG. 4 is a timing diagram 400 for signals in memory system 100 of FIG. 1 when signal buffer 125 is configured to support threading in accordance with another embodiment.

FIG. 4 is a timing diagram 400 for signals in memory system 100 of FIG. 1 when signal buffer 125 is configured to support threading in accordance with another embodiment. In this mode signal buffer 125 reduces or eliminates the need for modifications to memory controller 110. In one example, signal buffer 125 communicates with memory controller 110 using a conventional, non-threaded protocol and with rank groups RG[1:0] via respective threads. Steering logic 140 thus minimizes the impact of implementing threading on memory controller 110. Threading supported on the module irrespective of threading support at the controller may be termed "module threading."

Considering FIG. 4 with reference to FIG. 1, steering logic 140 directs activate commands received on primary command interface PCA to a rank within either of rank groups RG0 or RG1 depending upon, e.g., a specified row address or chip select signal. In this example, steering logic 140 directs a first access command ACT0 to a rank within rank group RG0 via secondary command interface SCA0, and directs a second access command ACT1 to a rank within rank group RG1 via secondary command interface SCA1. Each activate command activates a row within the memory devices of the target rank.

Steering logic 140 divides each read request into two separate and temporally spaced secondary read requests specifying two columns within the active row. Read request RD_A (a read request to column A) is divided, for example, into a pair of secondary read requests RDAx and RDAy. Responsive to those requests, rank group RG0 returns two successive column accesses Ax and Ay, each of which includes thirty-two parallel eight-bit bursts. Steering logic 140 likewise divides read request RD_B into a pair of secondary read requests to obtain two successive column accesses Bx and By.

Steering logic 140 combines each pair of 32-byte column accesses and conveys the resulting 64-bytes to memory controller 110 via primary data groups PDQ[1:0]. The resultant combined column accesses Ax/Ay and Bx/By, as communicated across the primary data groups, are as described previously in connection with FIG. 2. Signal buffer 125 thus supports threading, and garners the attendant advantages, while remaining compatible with legacy controllers that do not support threading. Such module threading comes at the cost of a few clock cycles of latency, however, because signal buffer 125 cannot begin conveying the data on the primary data interface until access Ay begins arriving. This additional latency, or serialization penalty $t_{SP}$, lengthens the read time $t_{RD}$ by the eight-bit burst length in this embodiment.

In another embodiment signal buffer 125 reorganizes the bits within the column accesses in creating the module threads. An example of one such alternative bit organization is depicted as example 450 to the lower right of FIG. 4. As with the mode discussed above in connection with FIG. 3, the two secondary addresses specify different columns within the same row, and are conveyed sequentially over sixteen bit times. Row accesses to a given device thus cannot be spaced by less than sixteen bit times. In a DDR3 system, this access sequence avoids any $t_{FAW}$ violations with their attendant delays. The overall frequency of row activations is also reduced, which saves power and improves speed/performance.

In this and other examples successive data column accesses on the same interface (e.g., Ax and Ay) occur over a contiguous sequence of clock edges. In practice, back-to-back accesses to ranks that use the same data bus can introduce "bubbles" between threads due to the need to allow bus signals to settle between accesses. In contrast, back-to-back accesses to ranks that use different data busses can be accomplished more quickly. In some embodiments memory controller 110 can distinguish between these two types of back-to-back accesses and insert bubbles only where needed.

Figure 5:
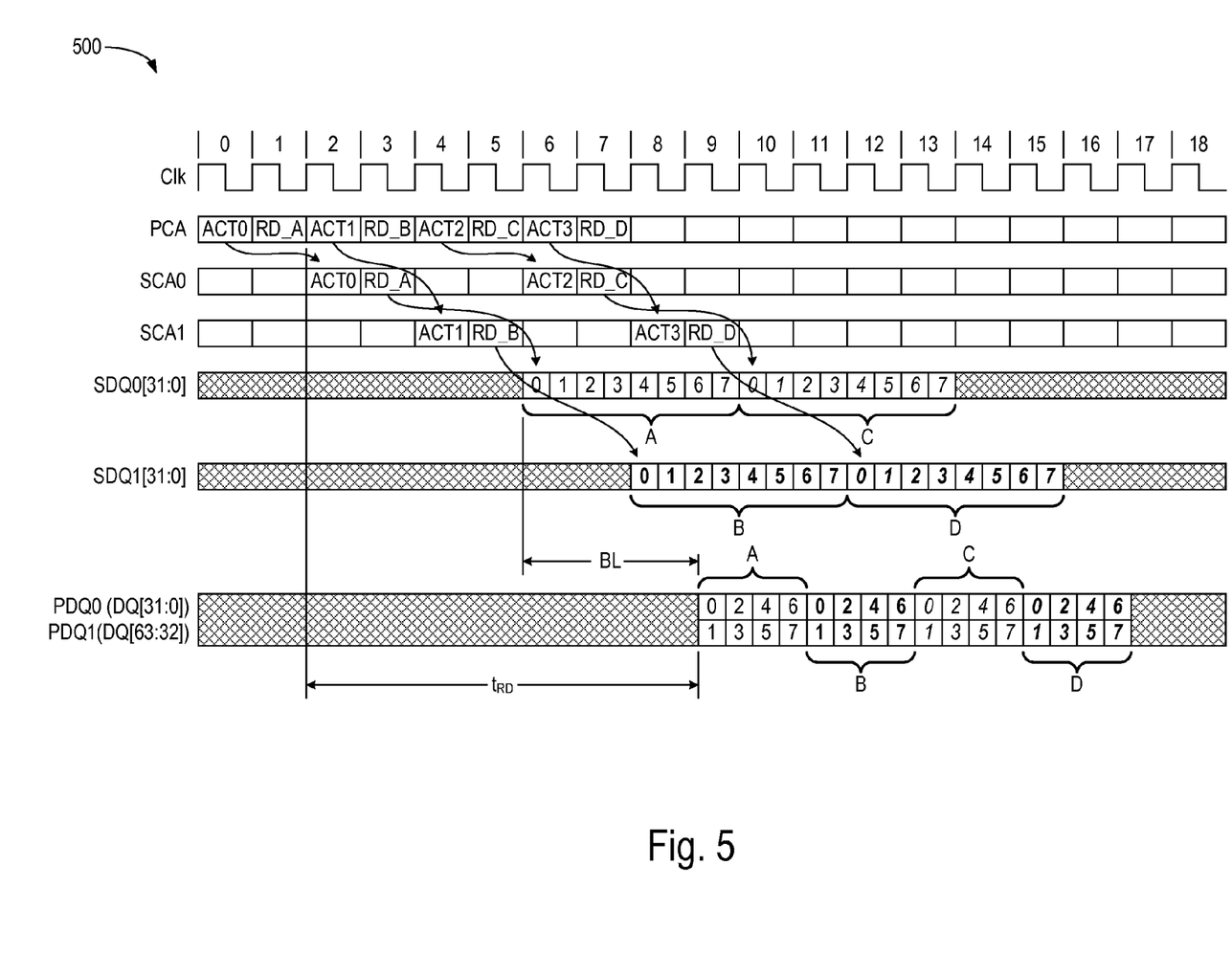
FIG. 5 is a timing diagram 500 for signals in memory system 100 of FIG. 1 when signal buffer 125 is configured to support threading in accordance with an embodiment that provides for a reduced access granularity to the controller.

FIG. 5 is a timing diagram 500 for signals in memory system 100 of FIG. 1 when signal buffer 125 is configured to support threading in accordance with an embodiment that provides for a reduced access granularity to the controller. FIG. 5 illustrates four consecutive read accesses. Memory controller 110 requests each access by issuing an activate command ACT specifying a row of memory and subsequent read command RD specifying a column. Signal buffer 125 relays each activate command and its associated read command to one or the other of rank groups RG[1:0] via a respective secondary command interface. Responsive to the activate and read commands, a selected rank group returns the requested data to signal buffer 125 over one of secondary data interfaces SDQ[1:0]. Signal buffer 125 then reorders the secondary data to double the width and halve the burst length. Memory controller 110 need not de-interleave and reassemble the transactions, which simplifies the adaptation of controller logic to this and similar threading schemes. Some embodiments may be implemented with minor firmware modifications to, e.g., a memory system's basic input/output system (BIOS) and little or no hardware modifications to conventional memory controllers.

In this example, column accesses A, B, C, and D represent independent 32-byte accesses. Memory controller 110 can enforce access restrictions that avoid back-to-back accesses to the same one of rank groups RG[1:0]. The accesses are delivered in the requested order and granularity, so memory controller 110 need not de-interleave and reassemble the accesses.

The DDR3 memory architecture supports a feature called "burst chop" that allows the memory controller to request four-bit bursts rather than eight. The DDR3 memory core still provides the same amount of data required for bursts of eight, but the interface circuit drops half the data. Unfortunately, data dropping still requires the data to be read, and consequently wastes power. The embodiment of FIG. 5 can be used with DDR3 memories to reorder eight-bit bursts to two parallel four-bit bursts, and thus provide the benefits of burst chop without the attendant inefficiency.

Figure 6:
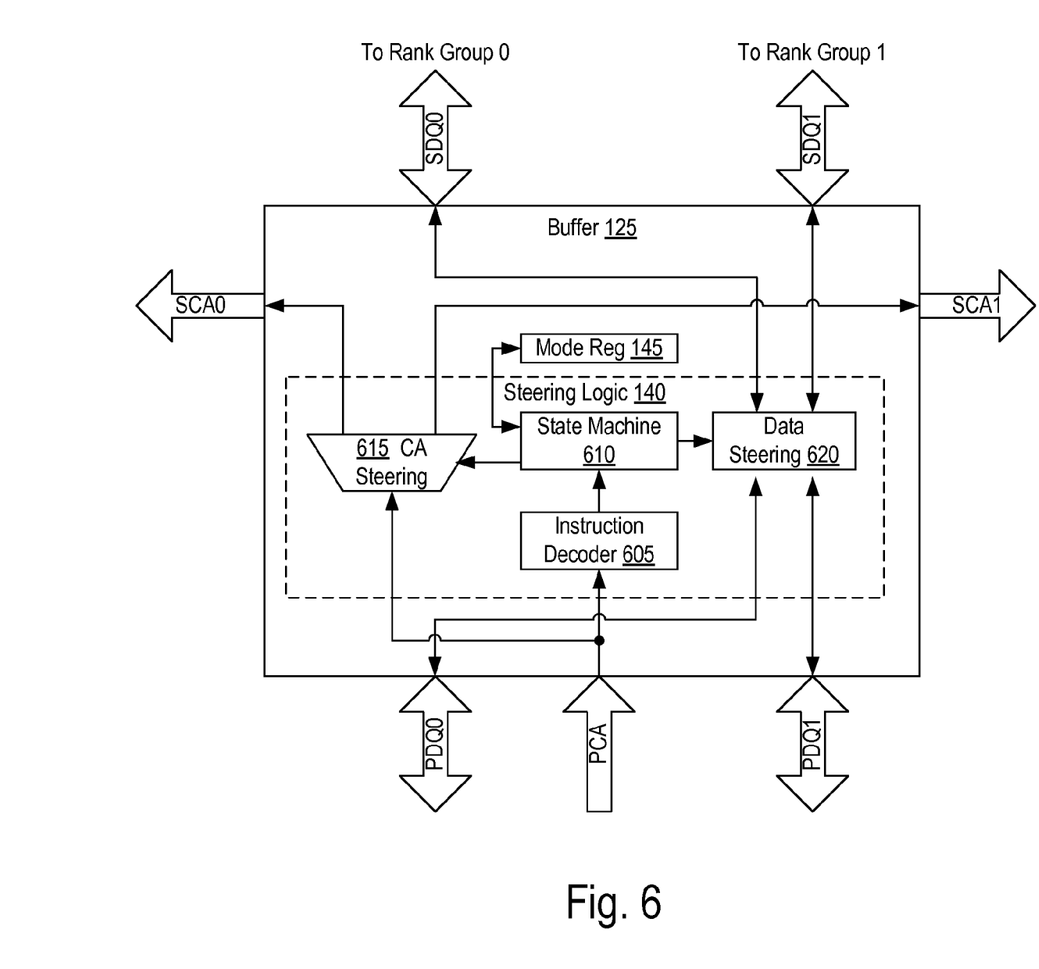

FIG. 6 details an embodiment of signal buffer 125 of FIG. 1, with like-identified elements being the same or similar. Steering logic 140 includes an instruction decoder 605 that receives and decodes instructions from primary command interface PCA to provide the decoded instructions to a finite state machine 610. Such instructions include conventional memory-access commands to facilitate, e.g., reading and writing of data, as are well known to those of skill in the art. Decoder 605 additionally recognizes a mode command in accordance with one embodiment that causes state machine 610 to load mode register 145 with a value indicative of an operational mode, examples of which are detailed above in connection with FIGS. 2-5.

State machine 610 controls command-steering logic 615 and data-steering logic 620 responsive to instructions from decoder 605 and the value in mode register 145. Depending on the mode, command-steering logic 615 directs commands either to both secondary command interfaces SCA[1:0] concurrently or to just one at a time, and data-steering logic 620 functions as a buffer (e.g., in the example of FIG. 2), or accomplishes module threading (e.g., in the examples of FIGS. 3-5). Implementation details for these embodiments will be evident to those of skill in the art based on the foregoing description and related figures.

Figure 7:
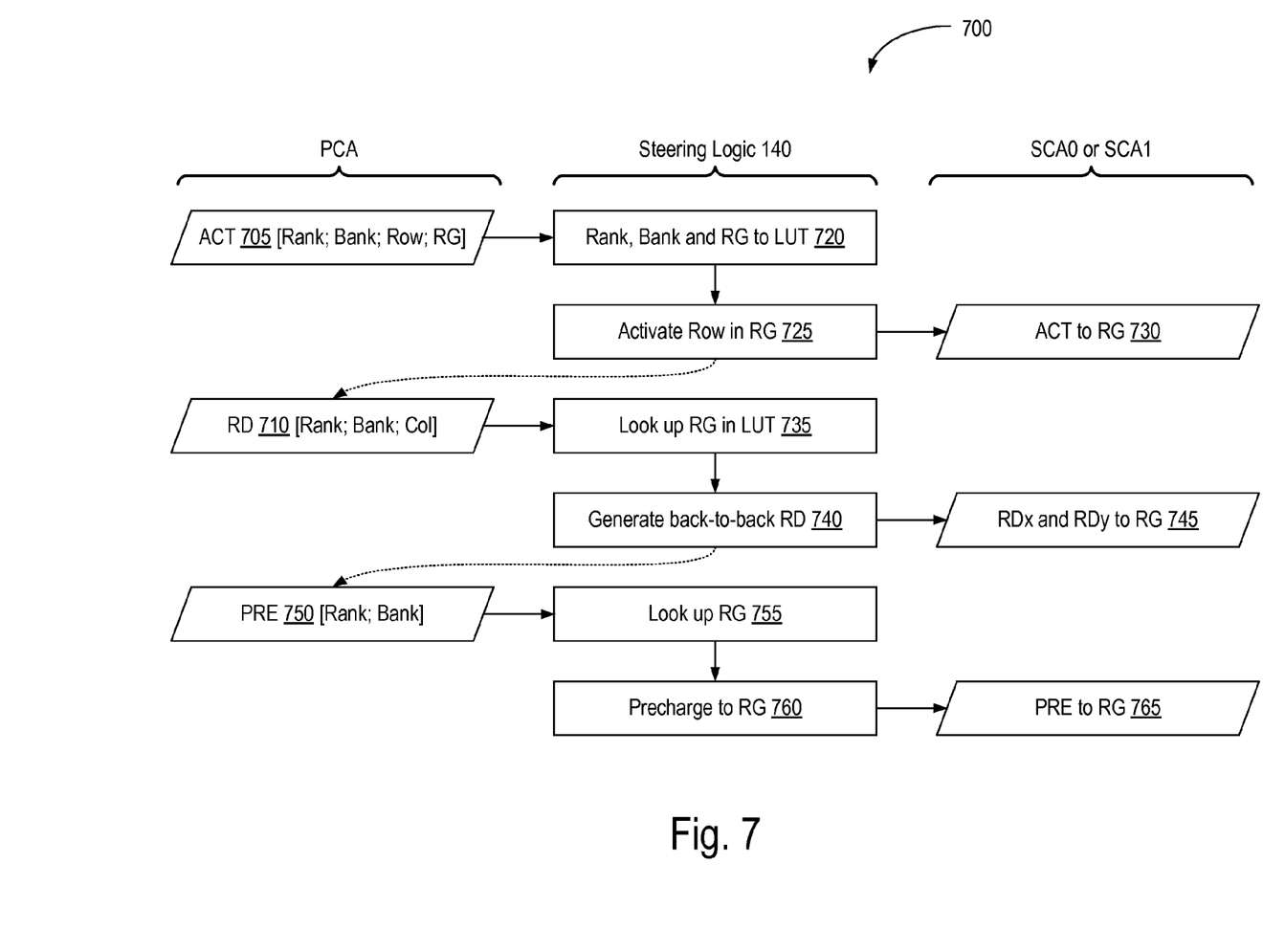
FIG. 7 is a flowchart 700 illustrating the operation of an embodiment of steering logic 140 of FIGS. 1 and 5 in accordance with an embodiment in which steering logic decodes a rank-group address from a row-address bit.

FIG. 7 is a flowchart 700 illustrating the operation of an embodiment of steering logic 140 of FIGS. 1 and 5 in accordance with an embodiment in which steering logic decodes a rank-group address from a row-address bit. Such embodiments do not require memory controllers to distinguish between rank groups, and may therefore simplify adoption of module threading.

The left column, labeled PCA, represents commands received from a memory controller via the primary command interface. In this example, these include an activate command ACT 705, a read command 710, and a precharge command 750. These commands may be conventionally formatted, so a detailed discussion is omitted. The center column, labeled steering logic 140, represents operations that this embodiment of steering logic 140 performs in response to the PCA commands. Finally, the rightmost column represents commands generated by steering logic 140 to perform back-to-back accesses (read accesses in this example) to one rank group RG. As indicated, these commands are passed to a selected rank group via one of secondary command interfaces SCA0 or SCA1.

Beginning at the upper left, activate command 705 specifies a Rank, Bank, and row address to steering logic 140. One row-address bit RG in command 705 specifies a rank group to steering logic 140, but the memory controller need not be aware of this fact. At 720, steering logic 140 stores the specified rank, bank, and rank group RG in a look-up table (LUT) for reasons discussed below. Also responsive to command 705, at 725 steering logic 140 issues a command 730 to activate a row in the specified rank, bank, and rank group.

Read command 710 specifies a rank, bank, and column, but does not distinguish between the two available rank groups RG0 and RG1. At 735, steering logic uses the designated rank and bank to look up the rank group RG stored in the LUT at 720, and then generates (740) and issues back-to-back read commands RDx and RDy (745) to the addressed row within the designated rank group.

At some point, potentially after one or more additional accesses to the same open row, steering logic 140 receives precharge command 750 to close the open row. Precharge command 750 specifies a rank and bank, which steering logic 140 uses to look up the associated rank group (755) stored earlier in 720. Steering logic 140 then generates a precharge command (760) and directs it to the open row in the designated rank group (765).

While FIG. 7 details an embodiment where the rank group is decoded from one or more row address bits, other embodiments may derive a rank group address from other portions of the address, including rank address (e.g. chip selects), or bank address. If the rank address is decoded from a portion of the address that is transmitted with every command, the LUT described in FIG. 7 is not needed.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Moreover, the foregoing descriptions focus primarily on read access, but these embodiments likewise support write access, as will be well understood by those of skill in the art.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, after reading this disclosure variations of these embodiments will be apparent to those of ordinary skill in the art. For example: the concepts detailed above can be extended to any combination of external and internal data widths; memory die in accordance with some embodiments can be soldered directly to a board and either permanently or programmably configured to a particular width; and the signal buffer can be provided on the motherboard, and possibly integrated with a memory controller, instead of included on the memory module with the memory devices. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A memory module comprising:
   a signal buffer having a module data interface to communicate module data, a module command interface to receive module commands, a first memory data interface, a second memory data interface, a first memory command interface, and a second memory command interface separate from the first memory command interface;
   a first memory device group, including at least one memory device, the first memory device group receiving first-memory commands from the first memory command interface and communicating first-memory data with the first memory data interface; and
   a second memory device group, separate from the first memory device group and comprising at least one memory device, the second memory device group receiving second-memory commands from the second memory command interface and communicating second-memory data with the second memory data interface;
   the signal buffer having steering logic to derive the first-memory commands and the second-memory commands from the module commands, and to communicate the module data associated with each module command between the module data interface and one of the first or second memory device groups as the first or second memory data, respectively;
   wherein the steering logic conveys the module data associated with each module command between the module data interface and one of the first and second memory data interfaces in a first mode and conveys the module data associated with each module command between the module data interface and both the first and second memory data interfaces in a second mode.

2. The memory module of claim 1, wherein the signal buffer includes a mode register to store a value indicative of the first mode or the second mode.

3. The memory module of claim 1, wherein the signal buffer, responsive to one of the module commands, issues multiple ones of the first-memory commands to the first memory device group.

4. The memory module of claim 3, wherein the multiple ones of the first-memory commands each specify the same row address.

5. The memory module of claim 3, wherein the signal buffer receives the first-memory data in multiple, successive column accesses responsive to the multiple ones of the first-memory commands and combines the column accesses to concurrently convey the first-memory data of the successive column accesses to the module data interface.

6. The memory module of claim 5, wherein the signal buffer conveys the data from the successive column accesses on separate subsets of pins in the module data interface.

7. The memory module of claim 5, wherein the signal buffer conveys the data from the successive column accesses, at different times, on a subset of pins in the module data interface.

8. The memory module of claim 1, wherein the signal buffer concurrently conveys the first and second memory data to the module data interface in a first mode and successively conveys the first and second memory data from the respective first and second memory device groups to the module data interface in a second mode.

9. The memory module of claim 8, wherein the signal buffer successively conveys the first and second memory data from the first and second memory device groups over a subset of all data pins of the module data interface.

10. The memory module of claim 1, wherein module data interface includes 2N data pins, the first memory command interface includes N data pins, and the second memory command interface includes N data pins.

11. The memory module of claim 10, wherein the signal buffer, responsive to the module commands, conveys an N-wide burst of data from the first memory device group and an N-wide burst of data from the second memory device group.

12. The memory module of claim 11, wherein the signal buffer, responsive to the module commands, combines the N-wide bursts of data from the first and second memory device groups into a 2N-wide burst of data on the module data interface.

13. The memory module of claim 12, wherein the signal buffer interleaves the N-wide bursts from the first and second memory device groups to produce the 2N-wide burst.

14. The memory module of claim 12, wherein the N-wide bursts of data are of a length M, and the signal buffer reorders the N-wide bursts to a length less than M.

15. The memory module of claim 1, wherein the first-memory data from the first memory command interface and the second-memory data from the second memory command interface each include at least one of a data-mask signal, a data-bus-inversion signal, and an error-detection-code signal.

16. The memory module of claim 1, wherein the module commands include a column-access-strobe command, and wherein the signal buffer translates the column-access-strobe command into two secondary column-access-strobe commands.

17. The memory module of claim 16, wherein the signal buffer successively conveys the two secondary column-access-strobe commands to one of the first and second memory device groups.

18. The memory module of claim 1, wherein the first memory device group comprises a first rank of interconnected memory devices, and the second memory device group comprises a second rank of interconnected memory devices.

19. A memory module comprising:

a signal buffer having a module data interface to communicate module data, a module command interface to receive module commands, a first memory data interface, a second memory data interface, a first memory command interface, and a second memory command interface separate from the first memory command interface;

a first memory device group, including at least one memory device, the first memory device group receiving first-memory commands from the first memory command interface and communicating first-memory data with the first memory data interface; and a second memory device group, separate from the first memory device group and comprising at least one memory device, the second memory device group receiving second-memory commands from the second memory command interface and communicating second-memory data with the second memory data interface;

the signal buffer having steering logic to derive the first-memory commands and the second-memory commands from the module commands, and to communicate the module data associated with each module command between the module data interface and one of the first or second memory device groups as the first or second memory data, respectively;

wherein the module commands include at least one of a row-address signal, and a chip-select signal, and wherein the signal buffer selects between the first and second memory device groups based on the at least one of the row-address signal, and the chip-select signal.

* * * * *